United States Patent
Liu et al.

(10) Patent No.: US 7,180,193 B2
(45) Date of Patent: Feb. 20, 2007

(54) VIA RECESS IN UNDERLYING CONDUCTIVE LINE

(75) Inventors: Chung-Shi Liu, Hsin-Chu (TW); Chen-Hua Yu, Hsin-Chu (TW); Horng-Huei Tseng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/823,159

(22) Filed: Apr. 13, 2004

(65) Prior Publication Data

US 2005/0224855 A1   Oct. 13, 2005

(51) Int. Cl.
*H01L 23/522* (2006.01)

(52) U.S. Cl. ............... 257/774; 257/751; 257/760; 257/E23.145

(58) Field of Classification Search ........ 257/750–766, 257/774, E23.145
See application file for complete search history.

(56) References Cited

U.S. PATENT DOCUMENTS 6,008,114 A * 12/1999 Li .................... 438/618
6,436,824 B1 * 8/2002 Chooi et al. ............. 438/687
6,613,664 B2 * 9/2003 Barth et al. .............. 438/629
2003/0089992 A1   5/2003 Rathi et al.
2003/0153198 A1   8/2003 Conti et al.
2005/0080286 A1 * 4/2005 Wang et al. ............. 556/410

* cited by examiner

*Primary Examiner*—Marcos D. Pizarro
(74) *Attorney, Agent, or Firm*—Slater & Matsil, L.L.P.

(57) ABSTRACT

A semiconductor device includes a dielectric layer, a conductive line, a via, and a via recess in the conductive line. The conductive line is underlying the dielectric layer. The via is formed in the dielectric layer and extends into the conductive line to form the via recess in the conductive line. The via recess formed in the conductive line has a depth of at least about 100 angstroms. Via-fill material fills the via recess and at least partially fills the via, such that the via-fill material is electrically connected to the conductive line. The via recess may have a same size or smaller cross-section area than that of the via, for example. Such via structure may be part of a dual damascene structure in an intermetal dielectric structure, for example.

27 Claims, 3 Drawing Sheets

VIA RECESS IN UNDERLYING CONDUCTIVE LINE

TECHNICAL FIELD

The present invention generally relates to fabricating semiconductor devices. In one aspect it relates more particularly to a method and structure for providing a via recess in an underlying conductive line.

BACKGROUND

FIG. 1 is a cross-section view for part of an intermetal dielectric structure 20 of a semiconductor device from the prior art. In FIG. 1, a conductive line 22 is underlying a dielectric layer 24. The conductive line 22 is formed in another dielectric layer (not shown in this view). The dielectric layer 24 in the example structure 20 shown in FIG. 1 includes a capped layer 26, which serves as a diffusion barrier and/or etch stop, and a layer of insulating material 28. A via 30 is formed in the dielectric layer 24 and opens to the conductive line 22. The capped layer 26 helps to control diffusion of underlying conductive lines and the etching of the via 30. A top portion of the via 30 may open to another conductive line (not shown in FIG. 1), for example, such as in a dual damascene structure. The via 30 of FIG. 1 is lined with a barrier layer 32 (e.g., Ta or TaN) and then filled with a conducting material 34 (e.g., copper). Hence, the conducting material 34 in the via is electrically connected to the underlying conductive line 22 through the bottom of the via 30 and through the barrier layer 32. Under ideal conditions for forming this structure 20 shown in FIG. 1, the bottom of the via 30 completely opens to the conductive line 22. During actual processing, however, the via 30 may only partially open to the underlying conductive line 22, as shown in FIG. 2.

In the case shown in FIG. 2, part of the capped layer 26 remains between the barrier layer 32 and the conductive line 22. This will likely increase the resistance between the conducting material 34 in the via 30 and the conductive line 22, which is typically undesirable. In an even worse case, the via 30 may not open to the conductive line 22 at all, as shown in FIG. 3. Thus in FIG. 3, the conducting material 34 may not be electrically connected to the conductive line 22 because the barrier layer 32 is not physically contacting the conductive line 22 and is separated from the conductive line 22 by a thin portion of the capped layer 26, which should have been etched away. In such case, a capacitor may be formed at the bottom of the via 30, which may be highly undesirable (e.g., when an low resistance electrical connection was desired). Such problems illustrated in FIGS. 2 and 3 may lead to higher resistance at the via and/or unstable yield and/or decreased reliability. Hence, there is a need for an improved via structure providing less resistance on average, more stable yields, and improved processing reliability.

SUMMARY OF THE INVENTION

The problems and needs outlined above may be addressed by embodiments of the present invention. In accordance with one aspect of the present invention, a semiconductor device is provided, which includes a dielectric layer, a conductive line, a via, and a via recess in the conductive line. The conductive line is underlying the dielectric layer. The via is formed in the dielectric layer and extends into the conductive line to form the via recess in the conductive line. The via recess formed in the conductive line has a depth of at least about 100 angstroms. Via-fill material fills the via recess and at least partially fills the via, such that the via-fill material is electrically connected to the conductive line.

In accordance with another aspect of the present invention, a semiconductor device is provided, which includes a dielectric layer, a conductive line, a via, and a via recess in the conductive line. The dielectric layer includes an insulating material layer and an capped layer. The capped layer has a dielectric constant less than about 4.0. The conductive line is underlying the dielectric layer. The via is formed in the insulating material layer, through the capped layer, and extends into the conductive line to form the via recess in the conductive line. The via recess formed in the conductive line has a depth of in a range from about 100 angstroms to about 800 angstroms. Via-fill material fills the via recess and at least partially fills the via, such that the via-fill material is electrically connected to the conductive line.

In accordance with yet another aspect of the present invention, a semiconductor device is provided, which includes a dielectric layer, a conductive line, a via, and a via recess in the conductive line. The dielectric layer includes an insulating material layer and a capped layer. The capped layer comprises silicon and carbon. The conductive line comprising copper is underlying the dielectric layer. The via is formed in the insulating material layer, through the capped layer, and extends into the conductive line to form the via recess in the conductive line. The via recess formed in the conductive line has a depth of in a range from about 100 angstroms to about 800 angstroms. Via-fill material fills the via recess and at least partially fills the via, such that the via-fill material is electrically connected to the conductive line.

In accordance with still another aspect of the present invention, a method of fabricating a semiconductor device is provided. This method includes the following steps described in this paragraph. The order of the steps may be sequential and/or may overlap. A via is formed in a dielectric layer and opens to a conductive line underlying the dielectric layer. A via recess is formed in the conductive line at the via. The via recess in the conductive line has a depth ranging from about 100 angstroms to about 800 angstroms.

The foregoing has outlined rather broadly features of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Figure 1:
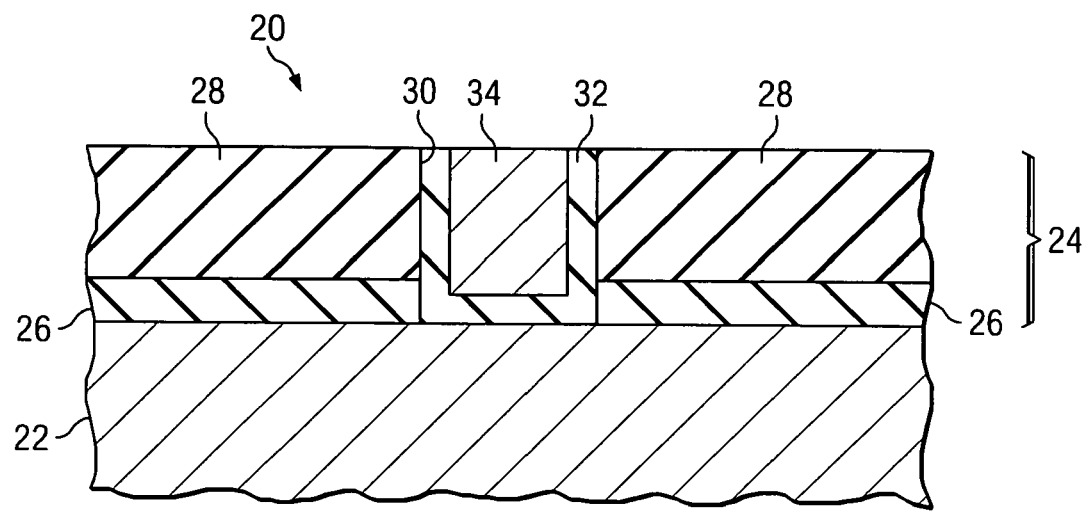
FIG. 1 is a cross-section view for part of an intermetal dielectric structure of a semiconductor device from the prior art.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Figure 4:
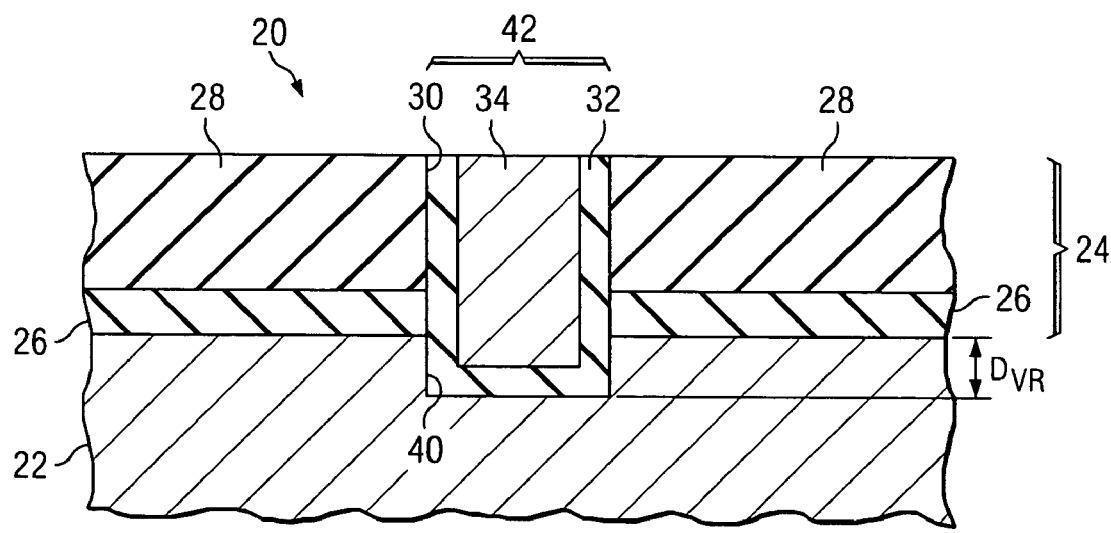
FIG. 4 is a cross-section view for a portion of a semiconductor device incorporating a first embodiment of the present invention.

FIG. 4 is a cross-section view for a portion 20 of a semiconductor device incorporating a first embodiment of the present invention. The portion 20 shown in FIG. 4 may be part of an intermetal dielectric structure, for example. In FIG. 4, a conductive line 22 is underlying a dielectric layer 24. The conductive line 22 is formed in another dielectric layer (not shown in this view). Generally, the conductive line 22 may include (but is not limited to): metal nitride, metal alloy, copper, copper alloy, aluminum, aluminum alloy and combinations thereof, for example. The dielectric layer 24 in the example structure shown in FIG. 4 includes a capped layer 26 and a layer of insulating material 28. The capped layer 26 may serve as a diffusion barrier and/or etch stop layer depending on the materials chosen. The dielectric layer 24 for an embodiment may be a layer of one homogenous material, a layer of a compound material, multiple-layers of different materials, or a composite structure of different materials, for example. In other embodiments (see e.g., FIG. 5, discussed below), the dielectric layer 24 may include one or more diffusion barrier layers and one or more insulating material layers, for example. In still other embodiments (not shown), the dielectric layer 24 may not have the capped layer 26, and/or a capped layer 26 may be provided at another level (e.g., at the top of the via 30 for a dual damascene structure). In yet other embodiments (not shown), the dielectric layer may include a composite structure of various dielectric materials. With the benefit of this disclosure, one of ordinary skill in the art may realize many other variations on the dielectric layer without departing from the scope of the present invention.

The capped layer 26 of FIG. 4 may be made from any suitable material(s), including (but not limited to): material comprising silicon-carbon compound having at least 30% carbon, silicon nitride ($Si_xN_y$), carbon-doped silicon nitride ($Si_xN_yC_x$), silicon oxynitride ($Si_xO_yN_z$), silicon-rich oxynitride, silicon-rich oxide, compounds thereof, composites thereof, and combinations thereof, for example. As an example, to reduce capacitance, the capped layer 26 is preferably a low-k dielectric material having a dielectric constant less than about 4.0. To further reduce capacitance, preferably the thickness of the capped layer 26 will not exceed 800 angstroms, for example. In addition to functioning as a diffusion barrier for an underlying conductor, such as copper atoms, the capped layer 26 of FIG. 4 also acts as an etch stop layer in defining via 30 according to materials chosen. The insulating material layer 28 of FIG. 4 may be made from any suitable dielectric material(s), including (but not limited to): silicon oxide ($SiO_x$), PSG, BPSG, FSG, $SiO_xC_y$, Spin-On-Glass, Spin-On-Polymers, compounds thereof, composites thereof, and combinations thereof, for example. The insulating material 28 is preferably a low-k dielectric material having a dielectric constant less than about 3 to reduce capacitance.

A via 30 is formed in the dielectric layer 24 and extends into the underlying conductive line 22 to form a via recess 40 in the conductive line 22. As measured from the top of the conductive line 22 at the via 30, the via recess 40 in the conductive line 22 preferably has a depth $D_{VR}$ of at least about 100 angstroms to provide more areas for subsequent metallic contact, to reduce via resistance, and to enhance physical adhesion between conductive line 22 and subsequent conductor 34. Lower via resistance will achieve higher performance circuits and better adhesion will result in a reliable metallization system. Especially when the size of via 30 is less than about 90 nanometers the via recess may be necessary to achieve a high performance and reliable circuit. In a preferred embodiment, the via recess 40 has a depth DVR in a range from about 150 angstroms to about 300 angstroms, for example.

Via-fill material 42 fills the via recess 40 and the via 30 in FIG. 4. In this example, the via-fill material 42 includes a barrier layer 32 and conducting material 34. The via-fill material 42 may be one homogenous material, a compound material, or a composite of different materials, for example. In FIG. 4, the conducting material 34 is electrically connected to the conductive line 22 through the barrier layer 32. The barrier layer 32 may be made from any suitable barrier layer material(s), including (but not limited to): tantalum, tantalum nitride, tungsten, compounds thereof, composites thereof, and combinations thereof, for example. The conducting material 34 may be any suitable conducting material(s), including (but not limited to): metal alloy, copper alloy, aluminum, aluminum alloy, tungsten, poly-crystalline silicon, compounds thereof, composites thereof, and combinations thereof, for example. In other embodiments (not shown), the via-fill material 42 may include one or more barrier layers and one or more conducting materials. In still another embodiment (not shown), there may be no barrier layer. With the benefit of this disclosure, one of ordinary skill in the art may realize many other variations on the via-fill material 42 without departing from the scope of the present invention.

Only a portion 20 of the semiconductor device is shown in FIG. 4 for purposes of simplifying the drawing. As will be apparent to one of ordinary skill in the art there are a variety of structures and components that may be formed above and below the portion 20 shown in FIG. 4, without departing from the scope of the present invention.

Figure 5:
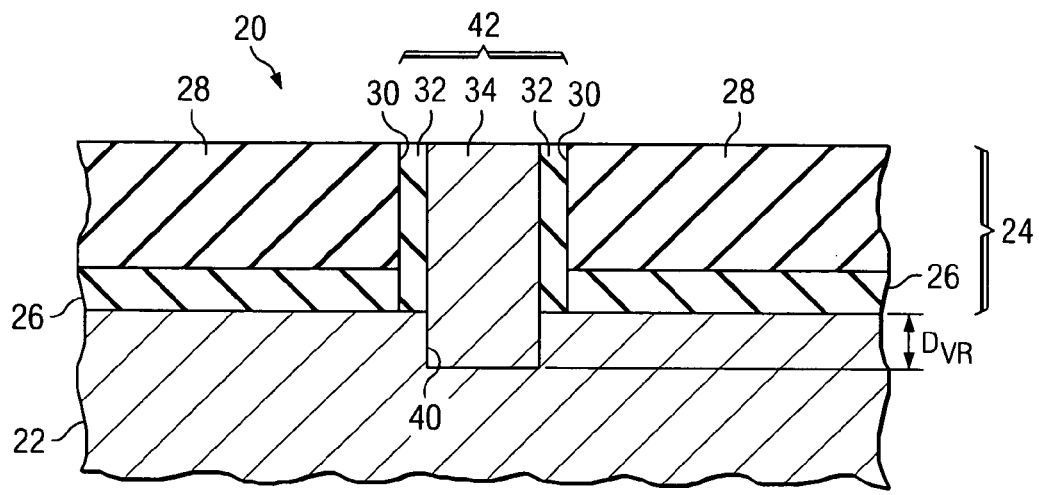
FIG. 5 is a cross-section view for a portion of a semiconductor device incorporating a second embodiment of the present invention.

There are numerous methods that may be used to fabricate a semiconductor device incorporating the first embodiment of the present invention and to arrive at the via structure shown in FIG. 4. For example, a conventional or future developed method of forming a via 30 (e.g., single or dual damascene techniques) may be used, but with the addition of one or more steps for forming the via recess 40 in the underlying conductive line 22. As an example, the process of forming the via 30 may be extended and continued until the via recess 40 is formed in the underlying conductive line 22. As another example, a pre-metal cleaning process may be performed separately (or an existing one in the fabrication process may be extended) to form the via recess 40 in the conductive line 22. Such a pre-metal cleaning process may include argon sputtering, ammonia-based reactive cleaning, hydrogen-based reactive cleaning, or combinations thereof, for example. With the benefit of this disclosure, one of ordinary skill in the art may realize other processes and methods of forming the via recess 40. In one method incorporating a pre-metal cleaning process, for example, the barrier layer 32 may be deposited prior to forming the via recess 40. In such method, the pre-metal cleaning etches through the barrier layer 32 in the bottom of the via 30 and continues to etch the via recess 40 in the underlying conductive line 22, for example. Such method may provide the via structure 20 of a second embodiment, as shown in FIG. 5. Hence, in the second embodiment, the via recess 40 has a smaller diameter (if cylindrically shaped) or a smaller cross-section area than that of the via 30. In another method incorporating a pre-metal cleaning process, the barrier layer 32 may be formed after a partial depth of or a full depth of the via recess 40 is formed, for example. After the via recess 40 is formed, a typical process of depositing via-fill material 42 into the via 30 may be used, for example.

Figure 6:
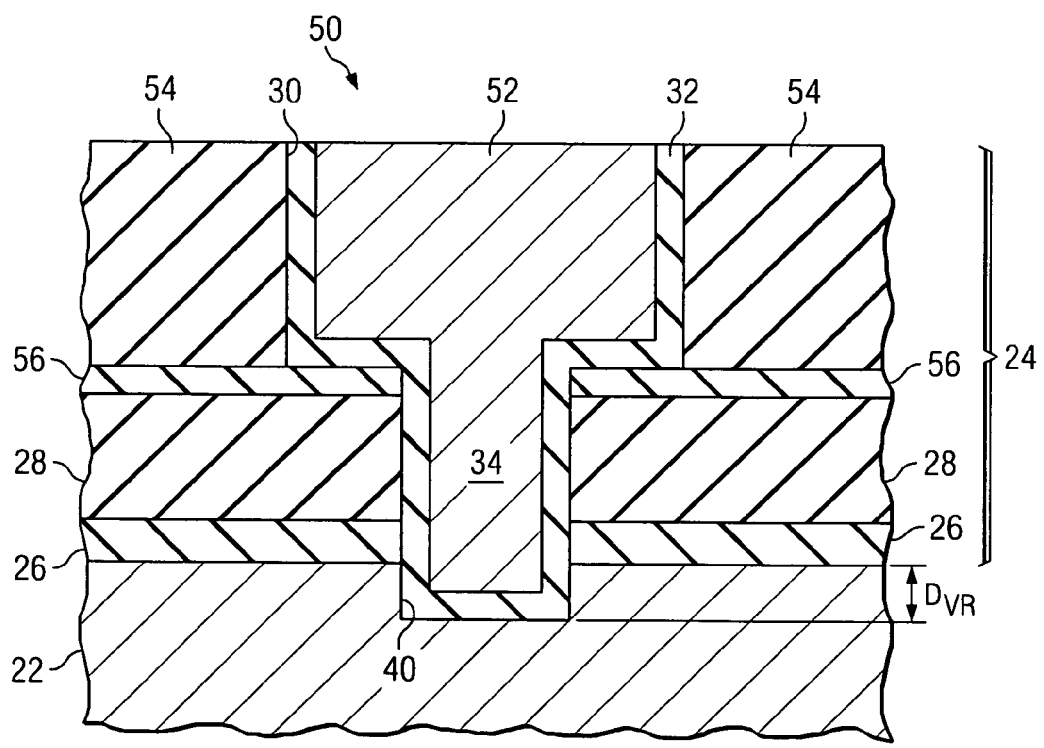
FIG. 6 is a cross-section view for a dual damascene structure of a semiconductor device incorporating a third embodiment of the present invention.

FIG. 6 is a cross-section view for a dual damascene structure 50 of a semiconductor device incorporating a third embodiment of the present invention. The third embodiment is essentially a certain variation of the first embodiment shown in FIG. 4. Hence, the dielectric layer 24 of the third embodiment shown in FIG. 6 has a dual damascene structure including another conductive line 52 formed therein. This other conductive line 52 is electrically connected to the conducting material 34 in the via 30, and as shown in FIG. 6, may include the same conducting material 34 as the via 30. In other embodiments (not shown), the other conductive line 52 may be made from different materials than that of the via-fill material 42, for example. Furthermore, the dielectric layer 24 of the third embodiment shown in FIG. 6 has two insulating material layers 28, 54, one capped layer 26 and one etch stop layer 56. Use of etch stop layer 56 is an optional step. Such insulating material layers 28, 54 may be made of the same or different materials, for example. One of ordinary skill in the art will realize many different dual damascene structures, many different material structures and layouts for a dual damascene structure, and/or many different material choices for a dual damascene structure, as variations upon the third embodiment.

Figure 2:
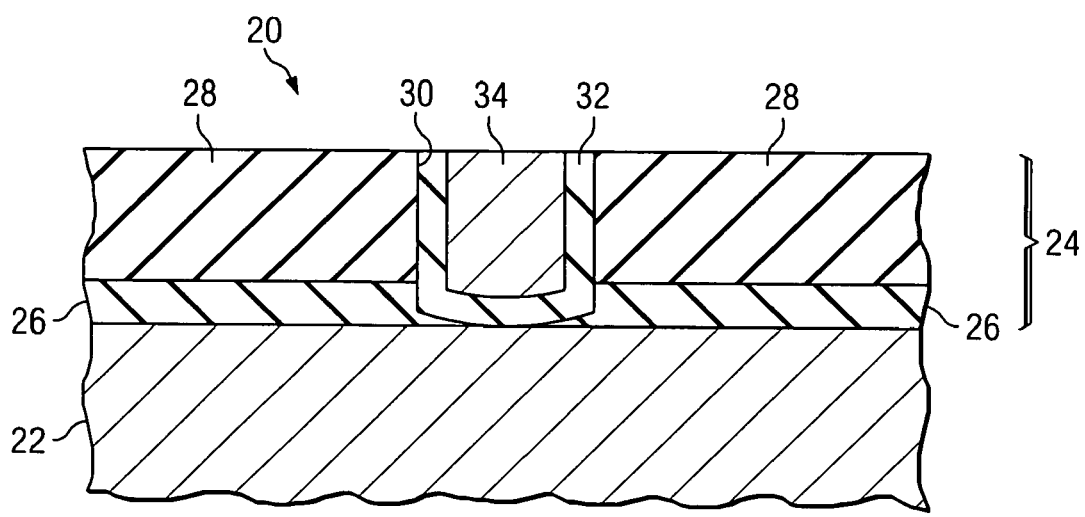
FIGS. 2 and 3 show variations on the via structure of FIG. 1.
Figure 3:
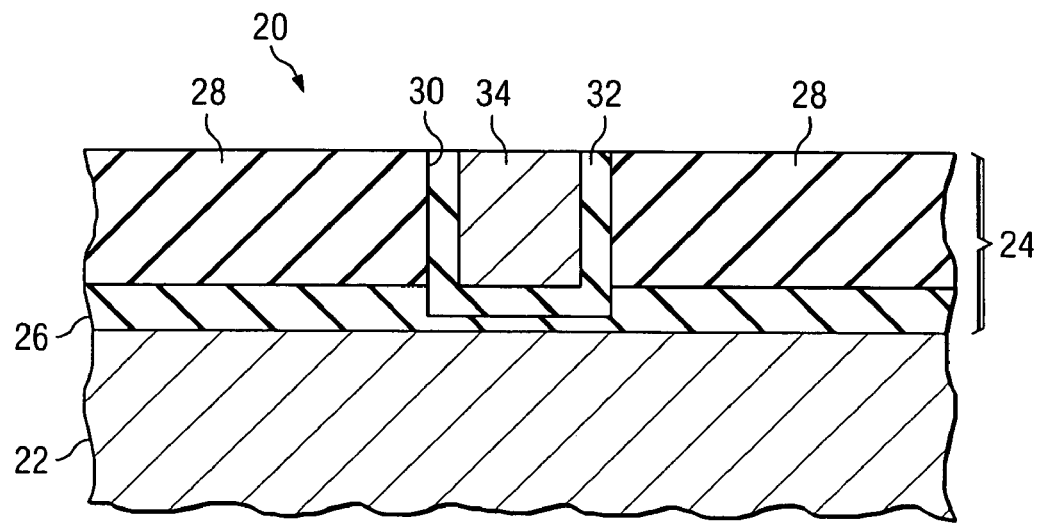

An embodiment of the present invention may have an advantage of providing a lower via resistance through forming via recess 40 to provide more contacting areas between conductive line 22 and barrier layer 32, as compared to a prior art via structure (see e.g., FIGS. 2 and 3). As another advantage, an embodiment of the present invention may provide a more stable and consistent via resistance yield through forming via recess 40 to provide more contacting areas to enhance adhesion between conductive line 22 and barrier layer 32, as compared to a prior art via structure (see e.g., FIGS. 2 and 3). Furthermore, an embodiment of the present invention may have an advantage of providing a better via electro-migration (EM) and stress migration (SM) resistance, as compared to a prior art via structure (see e.g., FIGS. 2 and 3). As compared to a prior art via structure (see e.g., FIGS. 1–3), an embodiment of the present invention may provide increased contact area between the via-fill material and underlying the conductive line. As compared to a prior art via structure (see FIGS. 1–3), an embodiment of the present invention may use a thin low dielectric constant capped layer, such as material comprising silicon-carbon, which may reduce capacitance of the metallization system and further improve circuit performance.

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
    a dielectric layer;
    a conductive line underlying the dielectric layer;
    a via formed in the dielectric layer and extending into the conductive line to form a via recess in the conductive line, the via recess formed in the conductive line having a depth between about 100 angstroms and about 600 angstroms; and
    via-fill material filling the via recess and at least partially filling the via, such that the via-fill material is electrically connected to the conductive line.

2. The semiconductor device of claim 1, wherein the depth of the via recess formed in the conductive line is between about 150 angstroms and about 300 angstroms.

3. The semiconductor device of claim 1, wherein the depth of the via recess formed in the conductive line is between about 300 angstroms and about 600 angstroms.

4. The semiconductor device of claim 1, wherein the conductive line comprises a material selected from a group consisting of metal alloy, copper, aluminum, copper alloy, poly-crystalline silicon, metal silicide, compounds thereof, composites thereof, and combinations thereof.

5. The semiconductor device of claim 1, wherein the dielectric layer has a dual damascene structure comprising another conductive line formed therein and being electrically connected to the conducting material in the via.

6. The semiconductor device of claim 1, wherein the via-fill material comprises:
    a barrier layer at least partially lining interior surfaces of the via recess and at least partially lining interior surfaces of the via; and
    a conducting material, wherein the barrier layer is located between at least part of the conducting material and at least part of the dielectric layer.

7. The semiconductor device of claim 6, wherein the conducting material is electrically connected to the conductive line through the barrier layer.

8. The semiconductor device of claim 6, wherein the barrier layer comprises a material selected from a group consisting of tantalum, tantalum nitride, tungsten, compounds thereof, composites thereof, and combinations thereof.

9. The semiconductor device of claim 6, wherein the conducting material comprises material selected from a group consisting of metal alloy, copper, copper alloy, aluminum, aluminum alloy, tungsten, poly-crystalline silicon, compounds thereof, composites thereof, and combinations thereof.

10. The semiconductor device of claim 9, wherein the depth of the via recess formed in the conductive line is between about 150 angstroms and about 300 angstroms.

11. The semiconductor device of claim 1, wherein the dielectric layer comprises:
a capped layer; and
a layer of insulating material overlying the capped layer.

12. The semiconductor device of claim 11, wherein the capped layer comprises carbon-doped silicon nitride ($Si_xN_yC_x$).

13. The semiconductor device of claim 11, wherein the capped layer has a dielectric constant less than about 4.0.

14. The semiconductor device of claim 11, wherein the capped layer has a thickness of less than about 600 angstroms.

15. The semiconductor device of claim 11, wherein the insulating material has a dielectric constant less than about 3.

16. The semiconductor device of claim 11, wherein the insulating material comprises a material selected from a group consisting of $SiO_xC_y$, FSG, Spin-On-Glass, Spin-On-Polymers, and combinations thereof.

17. The semiconductor device of claim 11, wherein the size of the via is less than about 900 angstroms.

18. The semiconductor device of claim 11, wherein the capped layer is a material comprising silicon-carbon having a thickness less than about 600 angstroms.

19. The semiconductor device of claim 18, wherein the capped layer has at least 30% carbon.

20. A semiconductor device comprising:
a dielectric layer comprising axis insulating material layer and a capped layer, and the capped layer having a dielectric constant less than about 4;
a conductive line underlying the dielectric layer;
a via formed in the insulating material layer, through the capped layer, and extending into the conductive line to form a via recess in the conductive line, the via recess formed in the conductive line having a depth of in a range from about 100 angstroms to about 600 angstroms; and
via-fill material filling the via recess and at least partially filling the via, such that the via-fill material is electrically connected to the conductive line.

21. The semiconductor device of claim 20, wherein the conductive line is substantially made of copper.

22. The semiconductor device of claim 20, wherein the capped layer is made of material comprising silicon carbon and is located between the insulating material layer and the conductive line.

23. A semiconductor device comprising:
a dielectric layer comprising an insulating material layer and a capped layer, and the capped layer comprising silicon and carbon;
a copper-based conductive line underlying the dielectric layer;
a via formed in the insulating material layer, through the capped layer, and extending into the conductive line to form a via recess in the conductive line, the via recess formed in the conductive line having a depth of in a range from about 100 angstroms to about 600 angstroms; and
via-fill material filling the via recess and at least partially filling the via, such that the via-fill material is electrically connected to the conductive line.

24. The semiconductor device of claim 23, wherein the capped layer comprises at least 30% carbon.

25. The semiconductor device of claim 23, wherein the size of the via is less than about 900 angstroms.

26. The semiconductor device of claim 23, wherein the depth of the via recess formed in the conductive line is between about 150 angstroms and 300 angstroms.

27. The semiconductor device of claim 23, wherein the depth of the via recess formed in teh conductive line is between about 300 angstroms and 600 angstroms.

* * * * *